US012324186B2

(12) United States Patent
Fuergut et al.

(10) Patent No.: US 12,324,186 B2
(45) Date of Patent: Jun. 3, 2025

(54) POWER SEMICONDUCTOR DEVICE AND METHOD (71) Applicant: Infineon Technologies AG, Neubiberg (DE)

(72) Inventors: Edward Fuergut, Dasing (DE); Philipp Sebastian Koch, Gelugor (MY); Stephan Pindl, Ergoldsbach (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/004,187

(22) Filed: Aug. 27, 2020

(65) Prior Publication Data
US 2021/0066495 A1 Mar. 4, 2021

(30) Foreign Application Priority Data
Aug. 27, 2019 (DE) .......................... 102019122888.3

(51) Int. Cl.
*H10D 30/66* (2025.01)
*H10D 30/01* (2025.01)
*H10D 62/83* (2025.01)
*H10D 64/27* (2025.01)

(52) U.S. Cl.
CPC ....... *H10D 30/665* (2025.01); *H10D 30/0291* (2025.01); *H10D 30/668* (2025.01); *H10D 62/8303* (2025.01); *H10D 64/513* (2025.01)

(58) Field of Classification Search
CPC .......... H01L 21/02527; H01L 29/7811; H01L 23/3732; H01L 21/02115; H01L 23/3171; H01L 23/3192
See application file for complete search history.

(56) References Cited

U.S. PATENT DOCUMENTS

| 4,972,250 | A | 11/1990 | Omori et al. |
| 8,466,492 | B1* | 6/2013 | Mauder ............... H01L 29/0653 257/E29.015 |
| 9,780,181 | B1* | 10/2017 | Teo ..................... H01L 29/2003 |
| 2002/0195702 | A1* | 12/2002 | Akram .................... H01L 24/16 257/713 |
| 2003/0157746 | A1 | 8/2003 | Guttler et al. |
| 2005/0164482 | A1* | 7/2005 | Saxler ............... H01L 21/02527 257/E21.128 |
| 2005/0253496 | A1* | 11/2005 | Armitage ................ H01J 3/026 313/359.1 |
| 2008/0099768 | A1* | 5/2008 | Scarsbrook ....... H01L 29/66045 438/105 |
| 2008/0253496 | A1* | 10/2008 | McCarty ................ G21C 7/117 376/327 |

(Continued)

FOREIGN PATENT DOCUMENTS

| CN | 107393858 A | 11/2017 |
| DE | 102007039706 A1 | 2/2009 |
| WO | 9531006 A1 | 11/1995 |

*Primary Examiner* — Samuel A Gebremariam
*Assistant Examiner* — Jonas T Beardsley
(74) *Attorney, Agent, or Firm* — Murphy, Bilak & Homiller, PLLC (57) ABSTRACT

A power semiconductor device includes a semiconductor body having a front side surface, and a first passivation layer arranged above the front side surface. The first passivation layer is a polycrystalline diamond layer.

12 Claims, 11 Drawing Sheets (56) References Cited

U.S. PATENT DOCUMENTS

| | | | |
|---|---|---|---|
| 2008/0296773 A1* | 12/2008 | Stecher | H01L 23/3677 |
| | | | 438/533 |
| 2008/0298773 A1* | 12/2008 | Honjo | H04N 9/8205 |
| | | | 386/E9.036 |
| 2010/0264426 A1* | 10/2010 | Blair | C23C 16/278 |
| | | | 257/E21.042 |
| 2012/0232371 A1 | 9/2012 | Mech et al. | |
| 2012/0286289 A1 | 11/2012 | Dipalo et al. | |
| 2015/0001719 A1 | 1/2015 | Schmidt et al. | |
| 2015/0303260 A1* | 10/2015 | Niedernostheide | |
| | | | H01L 29/1095 |
| | | | 257/329 |
| 2016/0093748 A1* | 3/2016 | Mieczkowski | H01L 29/0692 |
| | | | 438/572 |
| 2016/0351413 A1 | 12/2016 | Schmidt et al. | |
| 2018/0047652 A1* | 2/2018 | Papadopoulos | H01L 23/3192 |
| 2021/0057305 A1* | 2/2021 | Yaita | H03F 1/3247 |

\* cited by examiner

POWER SEMICONDUCTOR DEVICE AND METHOD

TECHNICAL FIELD

This specification refers to embodiments of a power semiconductor device and to embodiments of a method of producing a power semiconductor device. In particular, this specification refers to aspects of a power semiconductor device having a passivation layer arranged above at least a portion of a front side surface.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device.

Further, for conducting the load current, the power semiconductor device may comprise one or more power cells which may be arranged in a so-called active area of the power semiconductor device. For example, in case of a controllable power semiconductor device, e.g., a transistor, the load current path may be controlled by means of an insulated electrode, commonly also referred to as gate electrode. For example, upon receiving a corresponding control signal from, e.g., a driver unit, the control electrode may set the power semiconductor device in one of a conducting state and a blocking state. In some cases, the gate electrode may be included within a trench of the power semiconductor switch, wherein the trench may exhibit, e.g., a stripe configuration or a needle configuration.

The power semiconductor device may be laterally confined by an edge, such as a lateral chip edge, and between the edge and the active area that comprises the one or more power cells, there may be arranged an edge termination region, which may comprise an edge termination structure. Such an edge termination structure may serve for the purpose of influencing the course of an electric field within the semiconductor body, e.g., so as to ensure a reliable blocking capability of the power semiconductor device. The edge termination structure may comprise one or more components arranged within the semiconductor body, and also one or more components arranged above a surface of the semiconductor body.

Usually the power semiconductor device comprises one or more passivation layers that are arranged above at least a portion of a front side surface of the semiconductor body, e.g., above at least a portion of an edge termination region. For example, such a passivation layer may be configured for hindering contaminating ions from entering into an edge termination structure.

It is a general trend to increase the power density in power semiconductor devices. In this context, but also more generally, it is desirable to provide novel passivation concepts that are improved, e.g., with regard to their influence on the device robustness and reliability and/or with regard to the area consumption of the edge termination region.

SUMMARY

Aspects described herein relate to a specific novel design of a front side passivation layer of a power semiconductor device that may, for example, yield an improved thermal robustness as well as a higher mechanical stability as compared to conventional passivation layers.

According to an embodiment, a power semiconductor device comprises: a semiconductor body having a front side surface; and a first passivation layer being arranged above the front side surface, wherein the first passivation layer is a polycrystalline diamond layer. For example, the first passivation layer may be structured in a horizontal plane, i.e., if viewed from above.

According to another embodiment, a method producing a power semiconductor device is presented. The method comprises: providing a semiconductor body having a front side surface; and forming a first passivation layer above the front side surface, wherein the first passivation layer is a polycrystalline diamond layer.

Those skilled in the art will recognize additional features and advantages upon reading the following detailed description, and upon viewing the accompanying drawings.

BRIEF DESCRIPTION OF THE DRAWINGS

The parts in the figures are not necessarily to scale. Instead, emphasis is placed upon illustrating principles of the invention. Moreover, in the figures, like reference numerals designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral (or horizontal) direction X and the second lateral (or horizontal) direction Y mentioned below and/or shown in the figures can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned below and/or shown in the Figures may be an direction that is perpendicular to both the first lateral direction X and the second lateral direction Y.

In this specification, n-doped is generally referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a single cell, a stripe cell or cellular (also referred to as "needle" or "columnar") cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, a derivative of a monolithically integrated diode cell (e.g., a monolithically integrated cell of two anti-serially connected diodes), a monolithically integrated transistor cell, e.g., a monolithically integrated IGBT or MOSFET cell and/or derivatives thereof. Such diode/transistor cells may be integrated in a power semiconductor module. A plurality of such power cells may constitute a cell field that is arranged with an active area of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., in the range from 1.2 kV to 2 kV, or up to at least 3 kV, or even up to 6 kV or more.

For example, the power semiconductor device described below may be a single semiconductor chip exhibiting a single cell configuration, a stripe cell configuration or a cellular cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

Figure 1A:
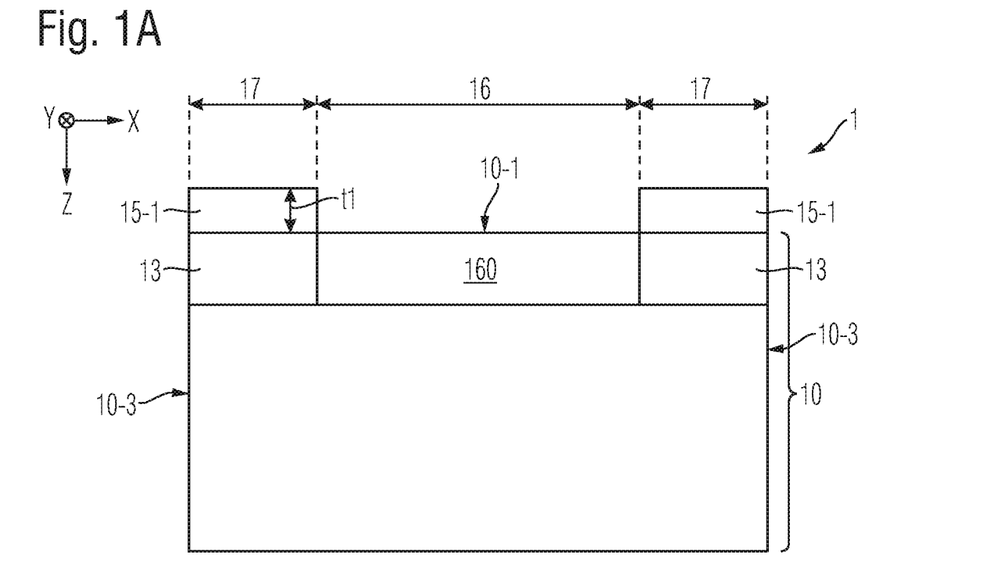
FIG. 1A-C each schematically and exemplarily illustrate a section of a vertical cross-section of a power semiconductor device in accordance with one or more embodiments.

FIG. 1A shows schematically and exemplarily a section of a vertical cross-section of a power semiconductor device 1 in accordance with one or more embodiments. The power semiconductor device 1 comprises a semiconductor body 10 having a front side surface 10-1. For example, the semiconductor body 10 may comprise or consist of a silicon-based substrate, a silicon carbide-based substrate, a gallium nitride-based substrate or, e. g., another wide band gap semiconductor substrate.

Further, an active area 16, which may also be referred to as an active cell area 16, is arranged below the front side 10-1. The active cell area 16 may comprise one or more power cells 160, which may be configured for conducting and/or a controlling a load current, e.g., between a first load terminal structure arranged at the front side of the semiconductor body 10 and a second load terminal structure arranged at a backside of the semiconductor body 10. Accordingly, in accordance with some embodiments, the power semiconductor device 1 may be configured as a vertical power semiconductor device 1.

For example, the power semiconductor device 1 is or comprises at least one of: a power diode, an IGBT, a reverse conducting IGBT (RC-IGBT), a MOSFET, a high-electron-mobility transistor (HEMT), such as a gallium based HEMT, and a thyristor.

In case the power semiconductor device 1 is or comprises a power diode, the active area 16 may comprise, for example, one large power cell 160, as exemplarily illustrated in FIG. 1A. For example, the power cell 160 may include a p-doped semiconductor region that is configured as an anode region and that is in contact with a front side metallization forming part of a first load terminal structure (not illustrated in FIG. 1A). For example, the anode region may form a pn-junction with an n-doped drift region of the semiconductor body 10.

Alternatively, in the case of a transistor configuration, e.g., in the form of an IGBT or a MOSFET, the active area 16 may comprise a plurality of transistor cells, which may, for example, in each case comprise a source region, a body region, and a gate electrode (such as a trench gate electrode) configured for selectively switching the power semiconductor device 1 in one of a forward conducting state and a forward blocking state.

The design of the active cell area 16 of such devices is, as such, well known to the person skilled in the art and will therefore not be explained in further detail here. Exemplary and schematic illustrations of active areas 16 comprising, for example, an anode region 162 of a diode or a plurality of transistor cells 161 of an IGBT are shown in FIGS. 4A-D and will be explained further below.

Besides the active area 16, the power semiconductor device 1 comprises an edge termination region 17 that extends between the active area 16 and a lateral chip edge 10-3. For example, the edge termination region 17 may laterally surround the active area 16, as schematically indicated in the cross-section view in FIG. 1A.

As used herein, the terms "edge termination region" and "active area" are both associated with the respective technical meaning the skilled person typically associates therewith in the context of power semiconductor devices. That is, the active area 16 is primarily configured for load current conduction and, in the case of a transistor configuration, switching purposes, whereas the edge termination region 17 primarily fulfills functions regarding reliable blocking capabilities, appropriate guidance of the electric field, and sometimes also charge carrier drainage functions, and/or further functions regarding protection and proper termination of the active area 16.

The edge termination region 17 may comprise an edge termination structure 13, which may be arranged at the front side of the semiconductor body 10. Such an edge termination structure 13 may also be referred to as a junction termination structure or briefly as a junction termination. For example, the edge termination structure 13 may comprise one or more components arranged within the semiconductor body 10 and/or one or more components arranged above the front side surface 10-1 of the semiconductor body 10.

Common examples of edge termination structures 13 are field rings (also referred to as guard rings), field plates, a combination of field rings and field plates, and a junction termination extension (JTE) edge termination structure, such as a a variation-of-lateral-doping (VLD) edge termination structure. The skilled person is well acquainted with these kinds of edge termination structures as such. Therefore, they will not be explained in detail at this point. FIGS. 4A-D show some exemplary and schematic illustrations of the edge termination structures 13 mentioned above. These will be explained in some more detail further below.

The power semiconductor device 1 further comprises a first passivation layer 15-1 that is arranged above the front side surface 10-1. For example, in an embodiment in accordance with FIG. 1A, the first passivation layer 15-1 may extend at least in a part of the edge termination region 17. For example, the first passivation layer 15-1 may be arranged at least partially above the edge termination structure 13 of the power semiconductor device 1, as schematically shown in FIG. 1A. Such a first passivation layer 15-1 that extends above an edge termination structure 13 may also be referred to as a junction termination passivation layer. Optionally the passivation layer 15-1 may extend into the active region 16.

The first passivation layer 15-1 is a polycrystalline diamond layer. Accordingly, in contrast to amorphous carbon passivation layers, which are commonly also referred to as diamond-like carbon (DLC) passivation layers, the first passivation layer 15-1 has a polycrystalline structure. For example, as a consequence, the first passivation layer 15-1 may have better electrical insulation properties (also at high temperatures) as well as an increased heat conductivity, e.g., as compared to a DLC passivation layer.

With regard to the polycrystalline structure of the first passivation layer 15-1, in an embodiment, the polycrystalline diamond layer 15-1 comprises crystals having a diameter of at least 10 nm, such as at least 20 nm, for example at least 50 nm. For example, the polycrystalline diamond layer 15-1 may comprise or consist of a so-called nanocrystalline diamond (NCD) material having crystals with a diameter of less than 100 nm. Additionally or alternatively, the polycrystalline diamond layer 15-1 may comprise or consist of a so-called microcrystalline diamond (MCD) material having crystals with a diameter of up to 5 μm.

In an embodiment, the polycrystalline diamond layer 15-1 has a thermal conductivity of at least 1200 W/(K m), such as at least 1500 W/(K m), such as at least 1800 W/(K m), e. g. at least 2000 W/(K m). For example, the first passivation layer 15-1 may thus exhibit good heat spreading characteristics, which may, for example, contribute to minimize self-heating effects occurring in the edge termination region 17, e.g., during turn-off in the case of a transistor configuration, such as an IGBT configuration, of the power semiconductor device 1.

Further, in an embodiment, the polycrystalline diamond layer 15-1 may be used as a heat spreader and/or thermal contact, e. g., in conjunction with thermoelectric cooling, such as by means of a Peltier device.

Still referring to thermal properties of the first passivation layer 15-1, in an embodiment, it may be provided that the polycrystalline diamond layer 15-1 has a specific heat capacity of at least 400 J/(kg K), such as, e.g., 427 J/(kg K).

With regard to electrical properties of the first passivation layer 15-1, in accordance with an embodiment, the polycrystalline diamond layer 15-1 has an electrical resistivity of at least $10^{13}$ Ohm cm. Hence, the first passivation layer 15-1 may have very good electrical insulation properties.

Further, in an embodiment, the polycrystalline diamond layer 15-1 has a dielectric strength of at least 1500 kV/mm, such as at least 1800 kV/mm, for example at least 2000 kV/mm. As a result, the first passivation layer 15-1 may, for example, contribute to a relatively high break-through voltage of the power semiconductor device 1.

Furthermore, the polycrystalline diamond layer 15-1 can prevent or at least reduce the indiffusion of detrimental atoms such as sodium, potassium, OH$^-$, Li etc. due to the low diffusion constants of such materials in diamond. If such atoms approach the semiconductor surface 10-1 or for the case that they diffuse into the semiconductor body 10 the electrical characteristics of such power semiconductor devices 1 can deteriorate.

Concerning mechanical properties of the first passivation layer 15-1, in accordance with one or more embodiments, the polycrystalline diamond layer 15-1 has hardness of at least 5, such as at least 7, such as, for example, 10 on the Mohs scale. As a result, the first passivation layer 15-1 may exhibit a very high mechanical stability, which may, for example, prevent scratching of sensitive underlying structures during frontend and/or backend manufacturing.

Regarding spatial dimensions of the first passivation layer 15-1, in an embodiment, a thickness t1 (e.g., as measured along the vertical direction Z) of the first passivation layer 15-1 is in the range from 30 nm to 2000 nm, such as in the range from 50 nm to 800 nm, for example in the range from 100 nm to 400 nm. In an embodiment, the thickness t1 may be in a range of up to 20 μm, or even up to 50 μm.

In an embodiment, the polycrystalline diamond layer 15-1 may cover essentially the whole edge termination region 17 or at least the whole edge termination structure 13. Alternatively, in the edge termination region 17, the polycrystalline diamond layer 15-1 may exhibit a patterned structure in the horizontal plane XY, i.e., if viewed from above.

Figure 1B:
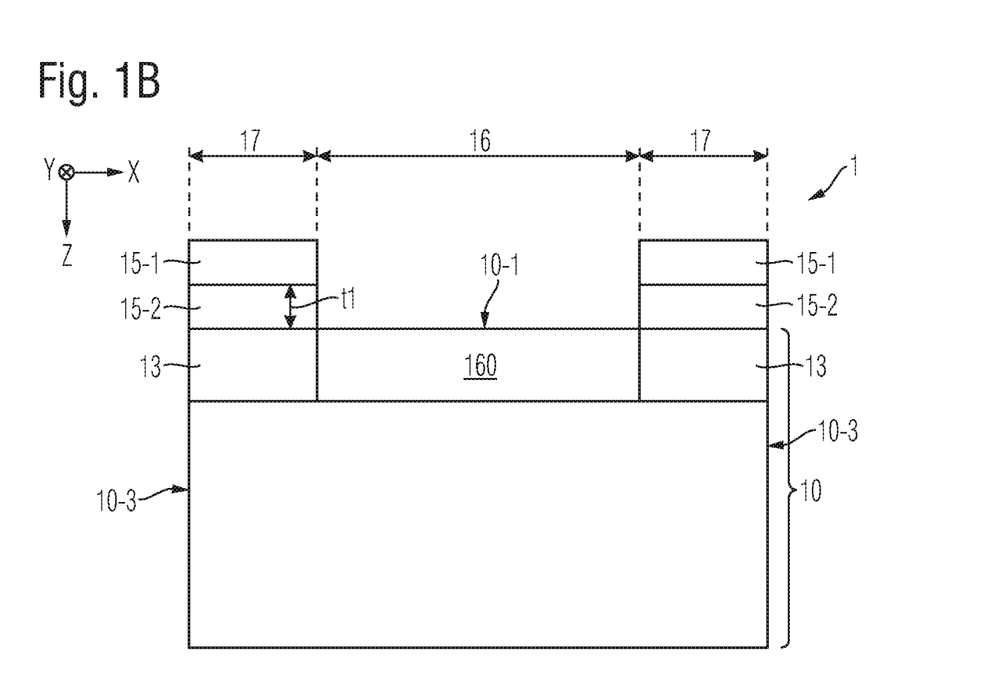

FIG. 1B schematically and exemplarily illustrates another embodiment, which differs from the one described above with reference to FIG. 1A in that, while the first passivation layer 15-1 is still arranged above the front side surface 10-1, a second passivation layer 15-2 is additionally arranged between the first passivation layer 15-1 and the front side surface 10-1.

In an embodiment, the second passivation layer 15-2 comprises at least one of the following materials: oxide, amorphous carbon, amorphous silicon, amorphous silicon carbide, and nitride.

Put differently and more generally, the polycrystalline diamond-based passivation layer 15-1 may be used in combination with one or more other passivation layers, such as an oxide-based layer, an amorphous carbon layer, an amorphous silicon layer, an amorphous silicon-carbide layer, or a nitride-based layer. For example, as schematically illustrated in FIG. 1B, the polycrystalline diamond layer 15-1 may form the upper layer of such a passivation stack.

Figure 1C:
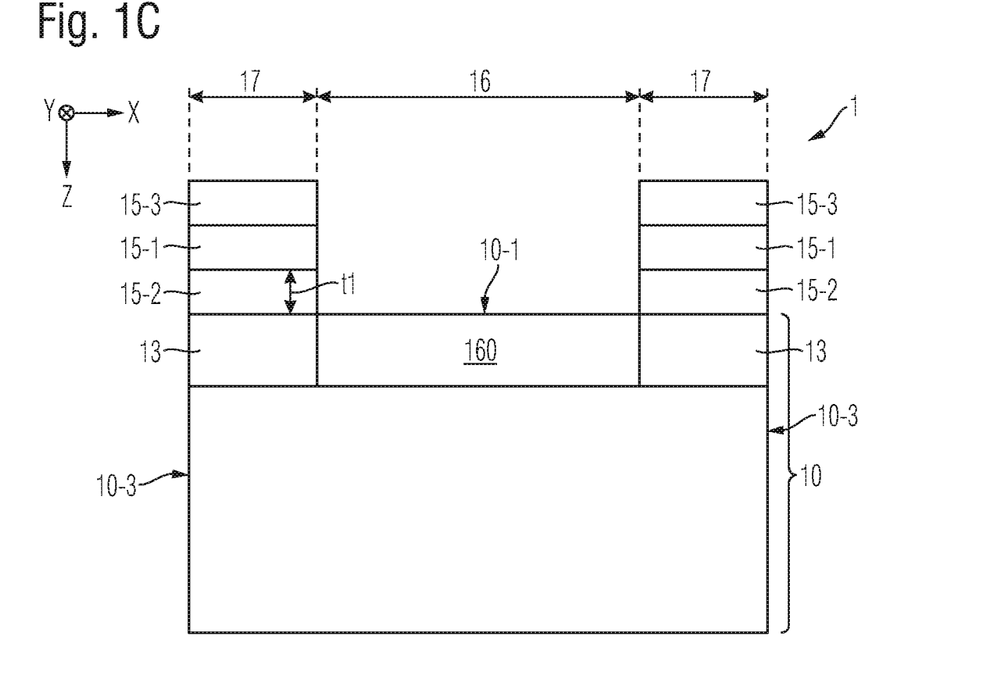

In another variant embodiment, which is schematically and exemplarily illustrated in FIG. 10, a third passivation layer 15-3, such as, e. g., at least one of a polyimide layer, an oxide layer, or a nitride layer, is arranged above the polycrystalline diamond passivation layer 15-1. For example, the third passivation layer 15-3 may be arranged and configured for further enhancing a breakdown voltage of the power semiconductor device 1. It should be noted that in another embodiment, the power semiconductor device 1 may comprise the first passivation layer 15-1 and a third passivation layer 15-3 being arranged above the first passivation layer 15-1, wherein in contrast to the example of FIG. 10 a second passivation layer 15-2 need not necessarily be present below the first passivation layer 15-1.

Optionally, the sticking of the first passivation layer 15-1 to underlying and/or overlying layers 15-2, 15-3 can be improved by means of one or more additional adhesion layers (not illustrated) and/or adhesion treatments like silanes, plasma activated surfaces, rough surfaces, or by employing other methods to control the surface free energy, which are in principle known to the person skilled in the art.

Figure 2A:
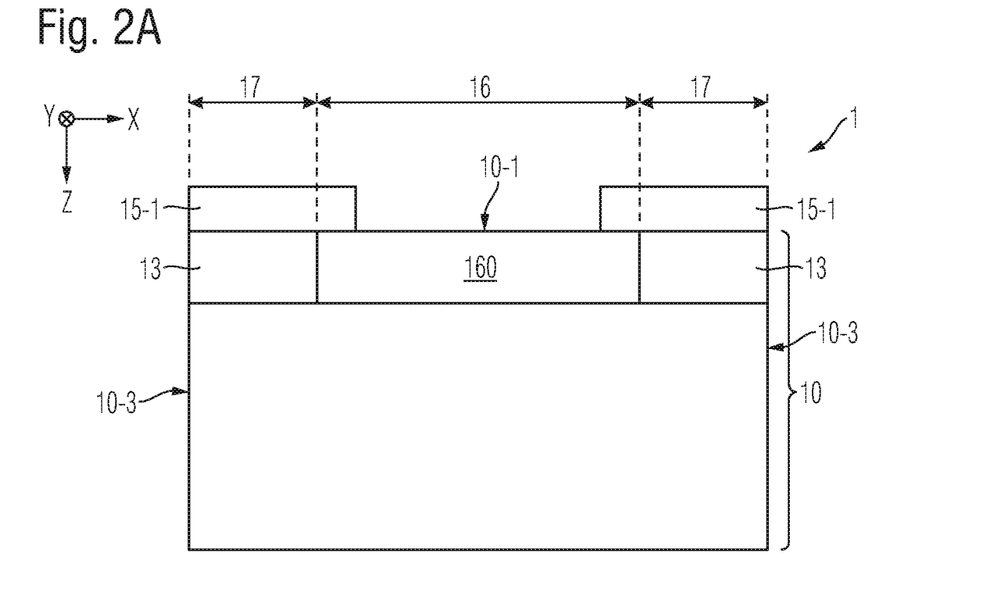
FIG. 2A-C each schematically and exemplarily illustrate a section of a vertical cross-section of a power semiconductor device in accordance with one or more embodiments.
Figure 2B:
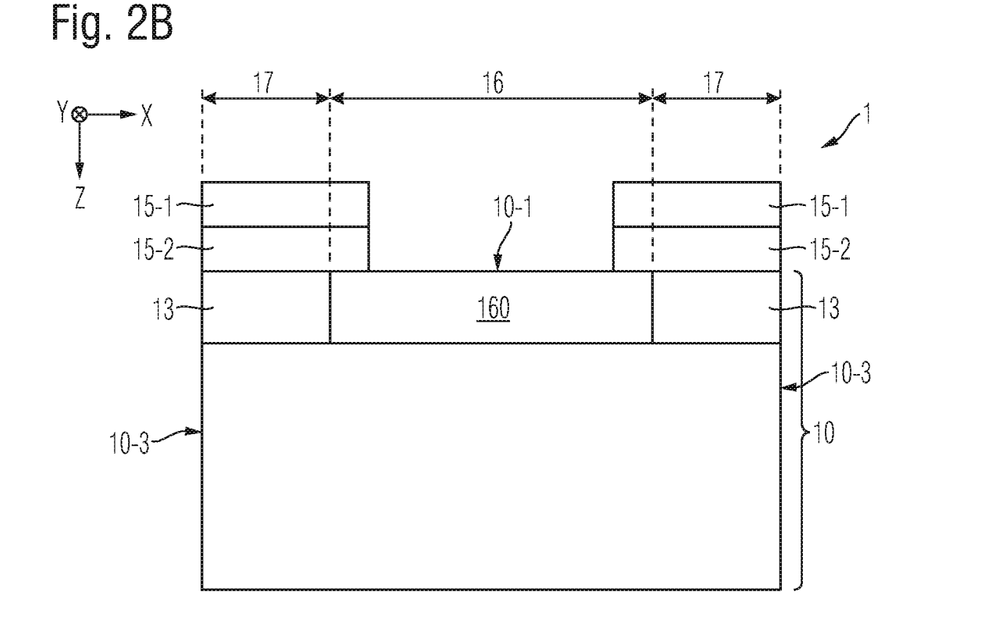
Figure 2C:
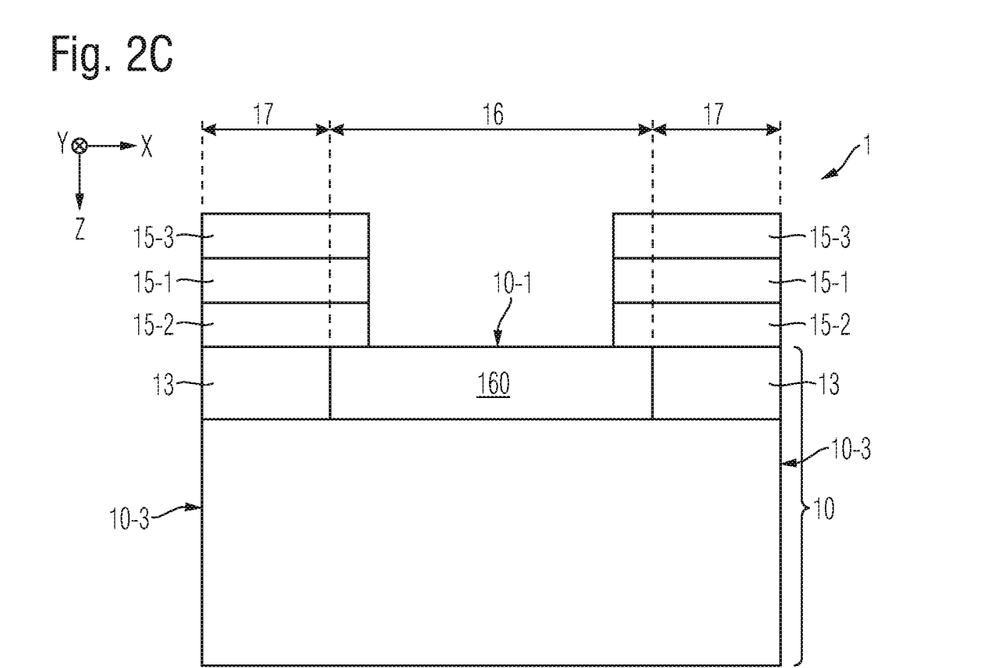

The cross-sectional views in FIGS. 2A, 2B, and 2C show variant embodiments, which differ from the ones explained above with reference to FIGS. 1A, 1B, and 10, respectively, in that the first passivation layer 15-1 is arranged partially in the active area 16 of the power semiconductor device 1. For example, the polycrystalline diamond layer 15-1 may thus be used as a local heat spread layer in the active cell area 16 and/or in the area 17 of the junction termination. For example, an overlap of the polycrystalline diamond layer 15-1 between the active area 16 (e.g., a front side metallization 11 that is arranged the active area 16; not illustrated in FIGS. 2A-C, cf. e.g. FIG. 3A) and the edge termination region 17 may be provided so as to allow for an effective dissipation of heat produced in the edge termination region 17. For example, the first passivation layer 15-1 may be arranged in contact with a front side metallization of the power semiconductor device 1.

Further, in an embodiment, a front side metallization may be divided in a plurality of contact pads, wherein the polycrystalline diamond layer 15-1 may at least partially extend (laterally) in between the contact pads (not illustrated). This may also apply to further contact pads, such as contact pads that may be provided for a temperatures sense functionality, a current sense functionality, or the like. For example, the contact pads may have a rectangular layout, such as a quadratic layout. Additionally or alternatively, a honeycomb layout or a layout based on another shape may employed.

Further, the portions of the polycrystalline diamond layer 15-1 that extend in the active area 16 may be configured for providing a flashover protection for the power semiconductor device 1, e.g., as a consequence of its relatively high dielectric strength.

For example, in an embodiment, the first passivation layer 15-1 and/or potential further passivation layers 15-2, 15-3 may only partially overlap the active area 16, as schematically shown in each of FIGS. 2A-C. This is to say that the passivation layers 15-1, 15-2, 15-3 may be structured in the horizontal plane XY, i.e., if viewed from above.

Figure 3A:
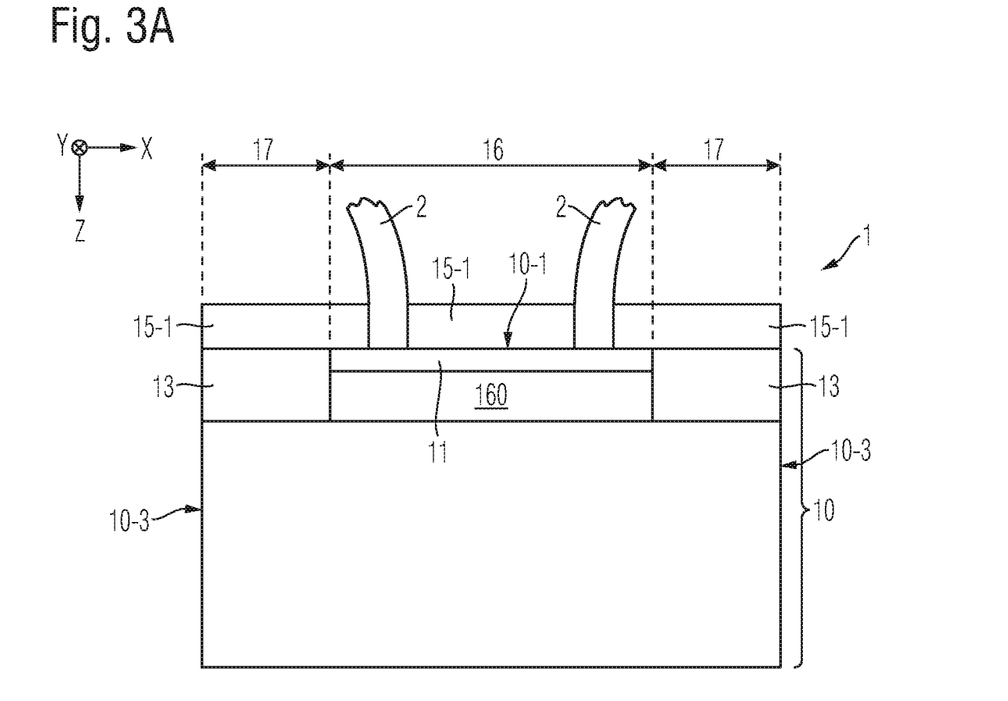
FIG. 3A-C each schematically and exemplarily illustrate a section of a vertical cross-section of a power semiconductor device in accordance with one or more embodiments.
Figure 3B:
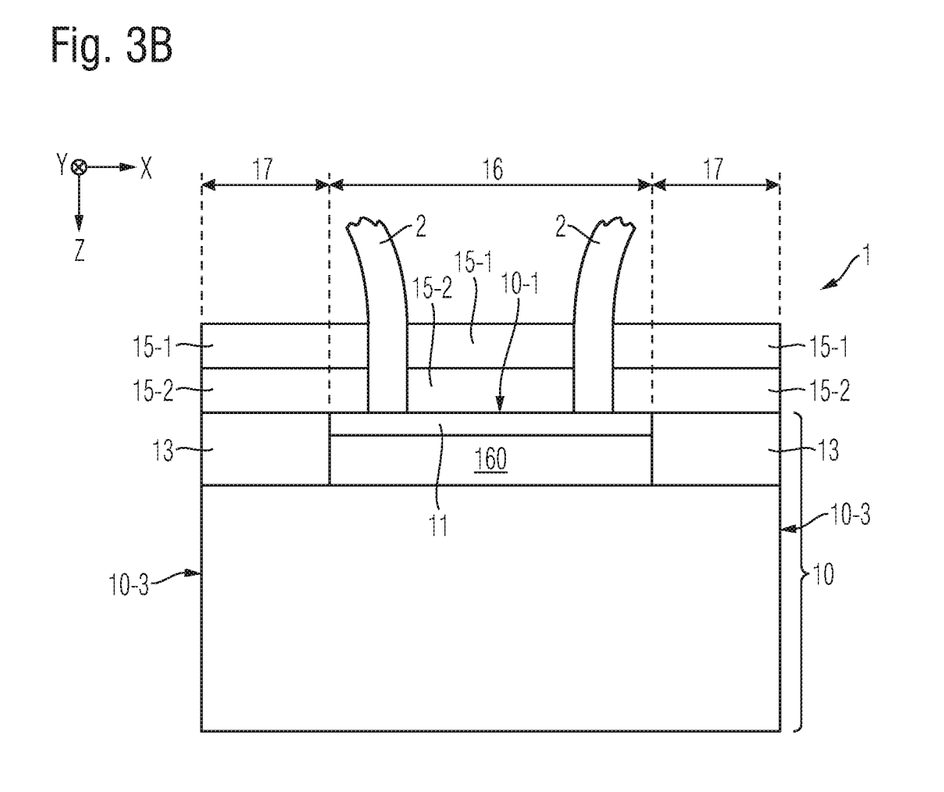
Figure 3C:
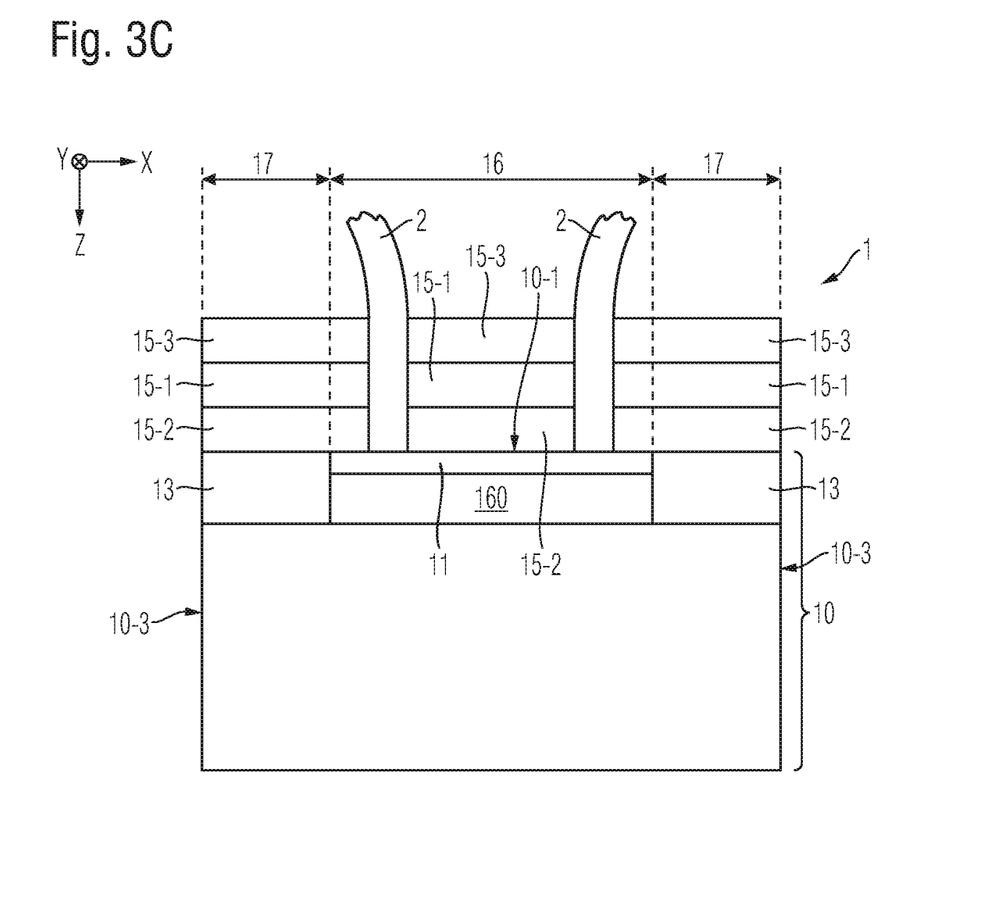

In further variant embodiments, which are schematically and exemplarily illustrated in FIGS. 3A-C, one or more of the passivation layers 15-1, 15-2, 15-3 may extend in the active area 16 (e.g., above a front side metallization 11, such as in contact with the front side metallization 11, as illustrated), wherein openings are provided for allowing one or more bond wires 2 to pass through the passivation stack. For example, such openings may be arranged above contact pads, such as gate pads, of the power semiconductor device 1. In an embodiment in accordance with each of FIGS. 3A-C, the one or more passivation layers 15-1, 15-2, 15-3 may cover the entire active area 16 except for such openings provided for bond wires 2 or for other electrical contacts such as clips or the like. It should be noted that the passivation layer(s) 15-1, 15-2, 15-3 need not necessarily be in direct lateral contact with the bond wires 2 as it is exemplary and schematic illustrated in FIGS. 3A-C. Rather, in some (not illustrated) embodiments, pad openings provided in the passivation layer(s) 15-1, 15-2, 15-3 may be larger than a diameter of the bond wires 2, such that ends of the bond wires 2 may be readily placed in the openings after the creation of the passivation layer(s) 15-1, 15-2, 15-3. However, in principle it would also be possible to connect the bond wires 2 first and only then create the one or more passivation layer(s) 15-1, 15-2, 15-3. In that case, a direct lateral contact between the bond wires 2 and the passivation layer(s) 15-1, 15-2, 15-3 as illustrated in FIGS. 3A-C may result.

In the following, several exemplary configurations of a power semiconductor device 1, including exemplary configurations of one or more power cells 160, 161, 162 in the active area 16 as well as exemplary configurations of edge termination structures 13, 131, 132 in the edge termination region 17, will be described with reference to FIGS. 4A-D. Each of FIGS. 4A-D shows a section of a vertical cross-section of a power semiconductor device 1, wherein the depicted section is in each case located close to a lateral chip edge 10-3 and includes a portion of the active area 16 as well an edge termination region 17 including an edge termination structure 13 that is arranged between the active area 16 and the lateral chip edge 10-3.

Figure 4A:
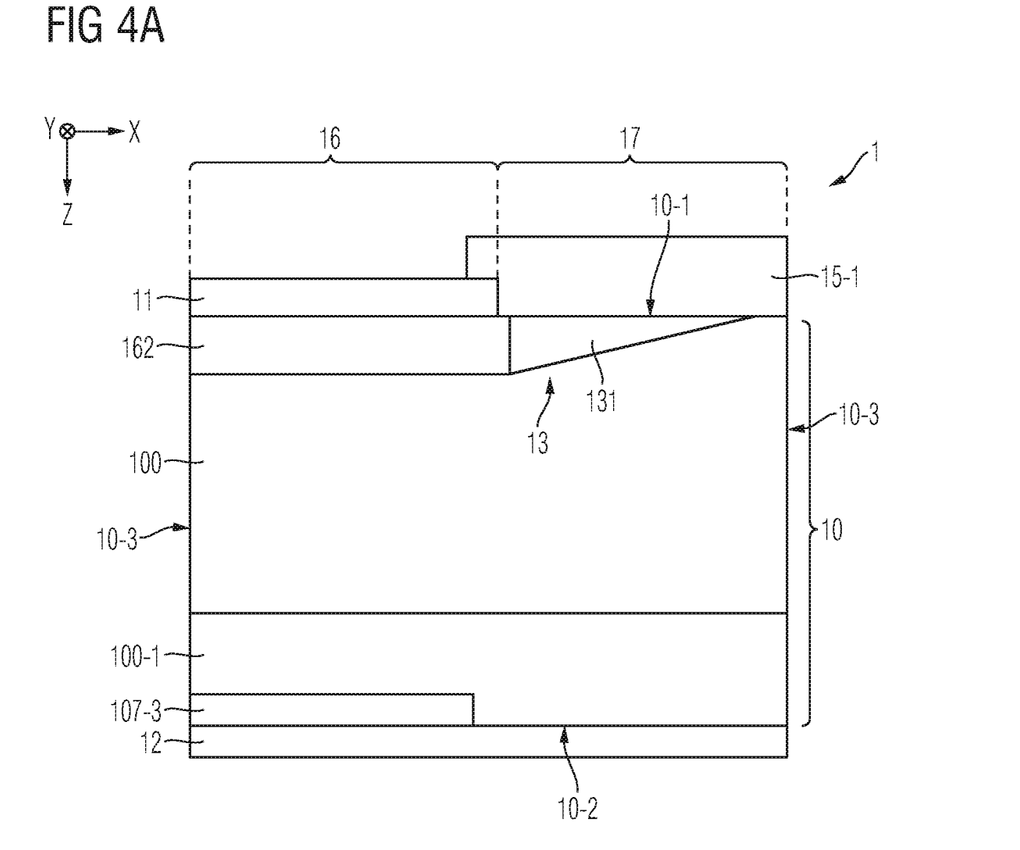
FIG. 4A-D each schematically and exemplarily illustrate a section of a vertical cross-section of a power semiconductor device in accordance with one or more embodiments.

In an embodiment that is schematically illustrated in FIG. 4A, the power semiconductor device 1 is configured as a diode. Accordingly, in the active area 16, the semiconductor body 10 comprises a backside doped region 107-3 of a first conductivity type (e.g., n-type, in which case the backside doped region 107-3 forms a cathode region) and a front side doped region 162 of a second conductivity type complementary to the first conductivity type (e.g. p-type, in which case the front side doped region forms an anode region). The front side doped region 162 extends inside the active area 16 along the front side surface 10-1 of the semiconductor body 10 and is in contact with a front side metallization 11, which forms a part of a first load terminal structure. Similarly, the backside doped region 107-3 extends inside the active area 16 along a backside surface 10-2 of the semiconductor body 10 and is in contact with a backside metallization 12, which forms a part of a second load terminal structure.

In between the front side doped region 162 and the backside doped region 107-3, a drift region 100 is provided. For example, the drift region 100 may have dopants of the first conductivity type at a relatively low dopant concentration, such as an intrinsic dopant concentration of the semiconductor substrate. For example, the drift region 100 may comprise an n$^-$-doped region. At the backside, the drift region 100 may comprise a field stop region 100-1 (sometimes also referred to as buffer region) having dopants of the first conductivity type at a higher dopant concentration than in the remaining portions of the drift region 100. Accordingly, the field stop region may be, for example, an n-doped region while the remaining portions of the drift region may be n$^-$-doped. In this case, the backside doped region 107-3 may be, e.g., an n$^+$-doped cathode region.

Turning now to the edge termination region 17, in the exemplary embodiment of FIG. 4A, the edge termination structure 13 is provided in the form of a so-called junction termination extension (JTE). This is to say that a JTE region 131 having dopants of the second conductivity type (e.g., at a lower dopant concentration than the front side doped region 162) extends along the front side surface 10-1 in the edge termination region 17. For example, the JTE region 131 may exhibit a VLD (variation of the lateral doping) profile with a decreasing dopant concentration in the direction of the lateral chip edge 10-3. The JTE region 131 may be a doped crystalline semiconductor region of the semiconductor body 10.

As schematically and exemplarily illustrated in FIG. 4A, the first passivation layer 15-1 may be arranged in the edge termination region 17 directly on the front side surface 10-1. Accordingly, in this case, at least a portion of the polycrystalline diamond layer 15-1 may be arranged in contact with a doped crystalline semiconductor region of the edge termination structure 13, namely, with the JTE region 131. In other embodiments, there may be arranged further layers, such as one or more oxide layers and/or one or more second passivation layers 15-2 as described above between at least a portion of the first passivation layer 15-1 and the JTE region 131.

Figure 4B:
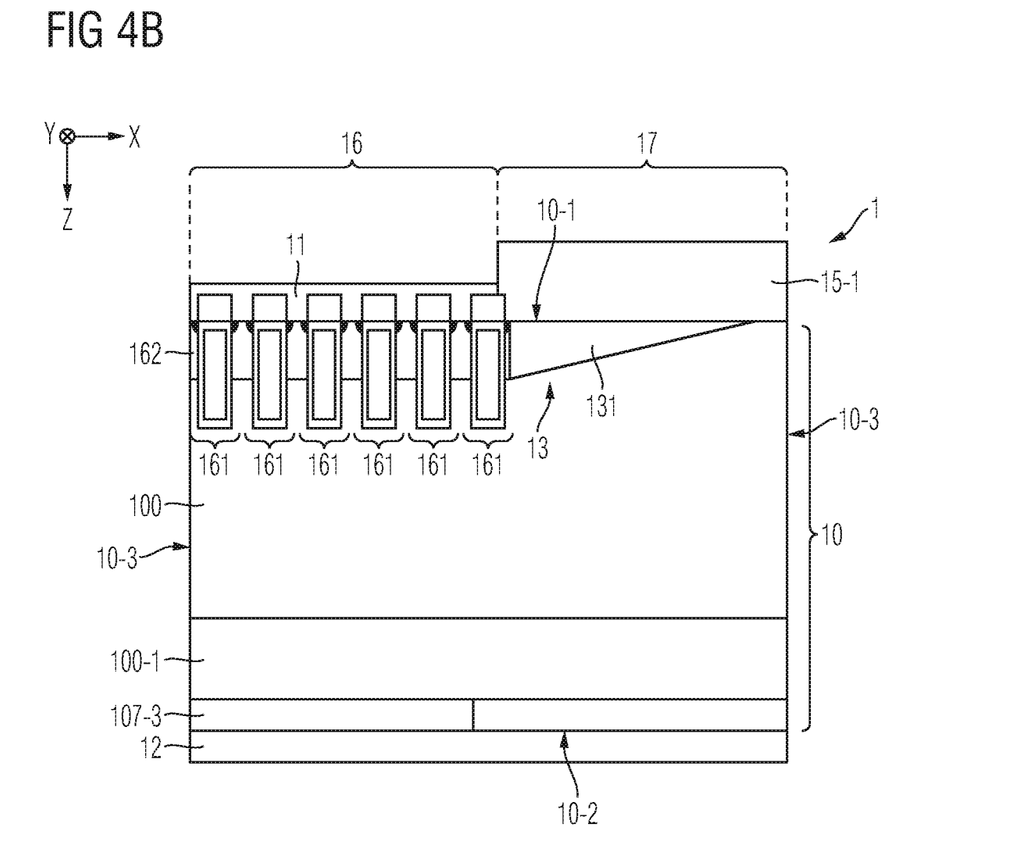

Referring now to FIG. 4B, in another exemplary embodiment, the power semiconductor device 1 may have an IGBT configuration. In this case the active area 16 may comprise a plurality of transistor cells 161, each comprising: one or more source regions of the first conductivity type, the source regions being coupled to a first load terminal structure, e.g., by means of a front side metallization 11; a body region of the second conductivity type, the body region separating the source regions from a drift region of the first conductivity type, wherein a transition from the body region to the drift region forms a pn junction; and an insulated gate electrode being configured for selectively inducing a conduction channel in the body region, the conduction channel extending from a source region to the drift region. For example, each transistor cells 161 may have a vertical trench gate configuration, as schematically illustrated in FIG. 4B. The skilled person is acquainted with the design of such IGBT transistor cells 161, which will therefore not be explained in more detail here. As is also well known to the skilled person, also in the case of an IGBT, the drift region 100 may include a field stop region 100-1, as described above with reference to FIG. 4A.

Further, in the active area 16, the semiconductor body 10 may comprise a backside emitter region 107-1 having dopants of the second conductivity type and extending along a backside surface 10-2 of the semiconductor body 10 in contact with a backside metallization 12 that forms part of a second load terminal structure. In the edge termination region 17, a weaker doped region 107-2 of the second conductivity type may be provided instead of the backside emitter region 107-1, such that an emitter efficiency at the backside may be reduced in a direction pointing from the active area 16 to the lateral chip edge 10-3. Such a concept is sometimes referred to as a HDR (High Dynamic Robustness) concept. The exemplary embodiment shown in FIG. 4B provides such a weakly doped HDR region 107-2. In other embodiments, the HDR functionality may be absent and the backside emitter region 107-1 may instead extend, for example, continuously along the entire backside surface 10-2.

Regarding the design of the edge termination region 17, also in the exemplary embodiment of FIG. 4B there may be provided a JTE region 131, which may, for example, have an VLD profile, as explained above with reference to FIG. 4A. For example, the JTE region may have dopants of the second conductivity type at a lower dopant concentration as compared to the body region(s) of the IGBT cells 161.

Further, as has also been explained above, in an embodiment, at least a portion of the first passivation layer 15-1 may be arranged in direct contact with at least a portion of the JTE region 131.

Figure 4C:
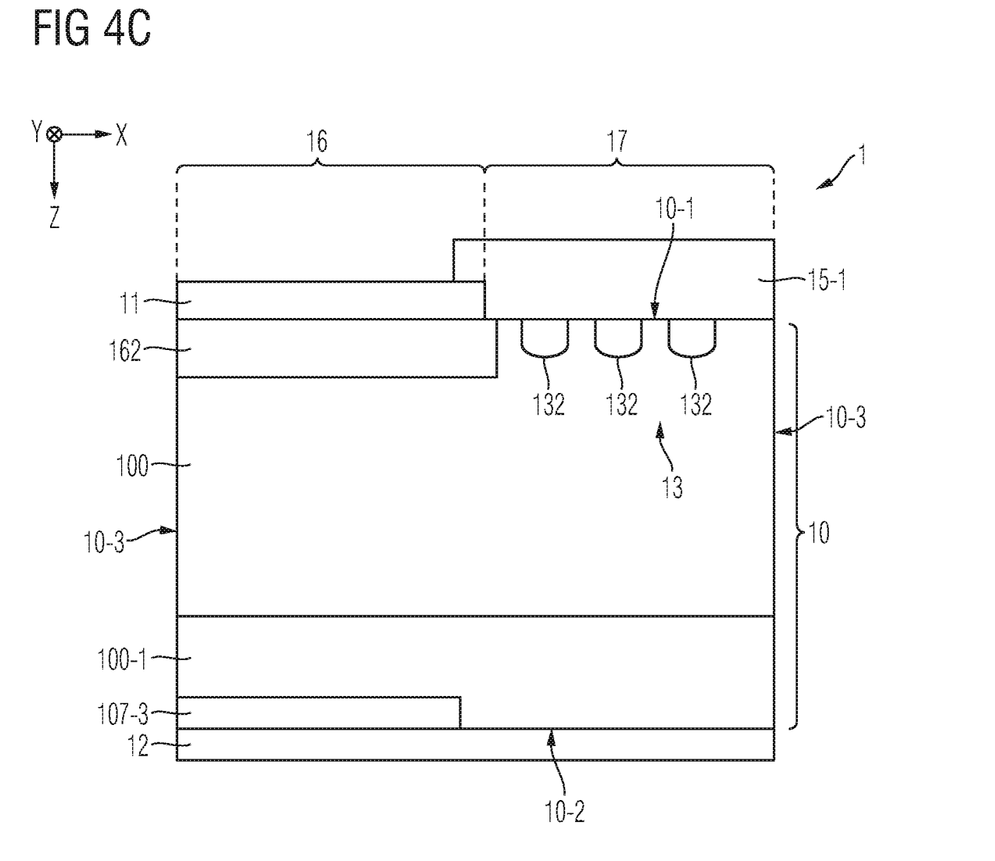

Referring now to FIG. 4C, in an embodiment, the edge termination structure 13 may comprise one or more field rings 132 instead of (or in addition to) a JTE region 131. Each field ring 132 may be configured as a doped semiconductor region of the second conductivity type being included in the semiconductor body 10 in contact with the front side surface 10-1 and may laterally surround the active area 16. For example, the field rings 132 may be electrically floating.

Figure 4D:
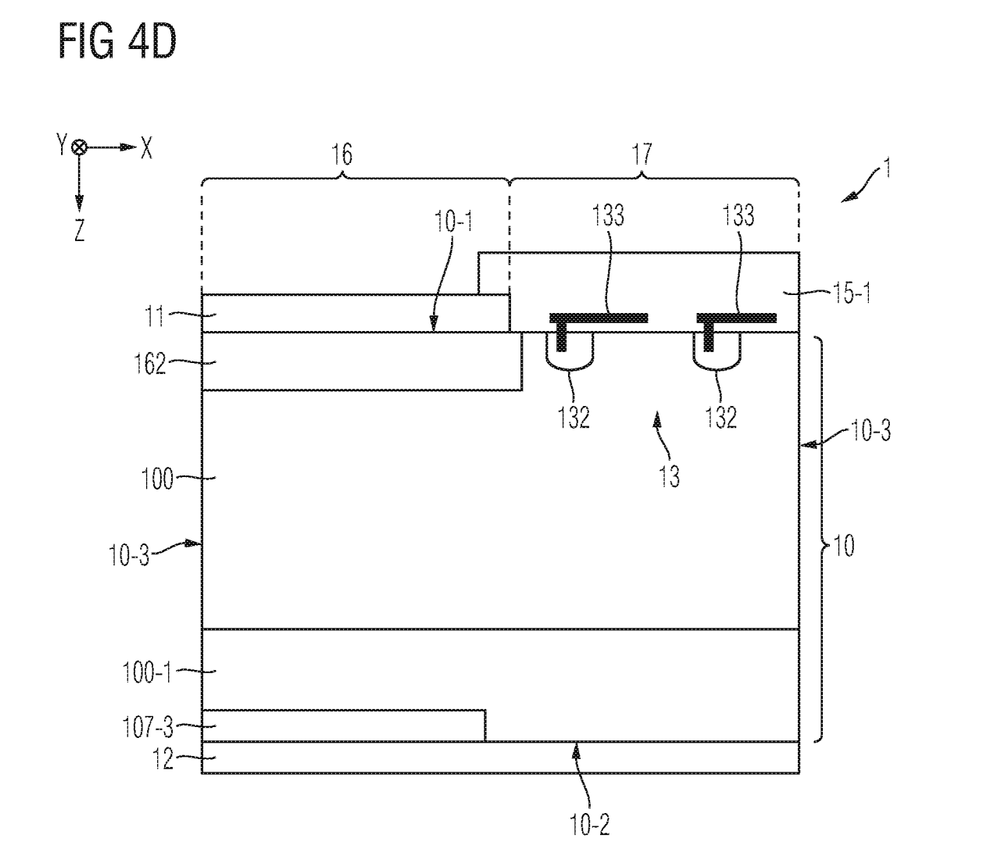

Further, in a variant embodiment that is schematically illustrated in FIG. 4D, a combination of field rings 132 with field plates 133 may be provided as an edge termination structure 13. For example, the field plates 133 may be configured for providing an effective screening of external charges. The field plates 133 may comprise, e.g., a metal, such as aluminum. Alternatively, such field plates 133 may be formed of polysilicon, for instance. For example, in an edge termination structure 13 combining field rings 132 with field plates 133, an electrical contact may be provided between each field plate 133 and a corresponding field ring 132, e.g., by means of a metallic contact plug.

Also in this embodiments shown in FIGS. 4C-D, the polycrystalline diamond layer 15-1 forming the first passivation layer may be in direct contact with a doped crystalline semiconductor region, namely, the one or more field rings 132, at the front side surface 10-1. However, in other variant embodiments, further layers (such an oxide or a second passivation layer 15-2) may be arranged in between at least a portion of the first passivation layer 15-1 and the front side surface 10-1.

It should also be noted that in another embodiment, which is not illustrated in the Figures, field plates 133 may be provided without field rings 132, i.e., an edge termination structure 13 may be entirely based on one or more field plates 133.

The skilled person is generally acquainted with a variety of edge termination concepts, such as JTE (e.g. with an VLD profile), field plates, field rings, and a combination of field plates and field rings.

Further, it should be noted that the edge termination structures 13 that have been explained above with reference to a diode 1 in FIGS. 4C-D, may as well be provided in power semiconductor devices 1 having a different configuration in the active area 16, such as, e.g., a transistor configuration as explained above with reference to FIG. 4B.

Figure 5:
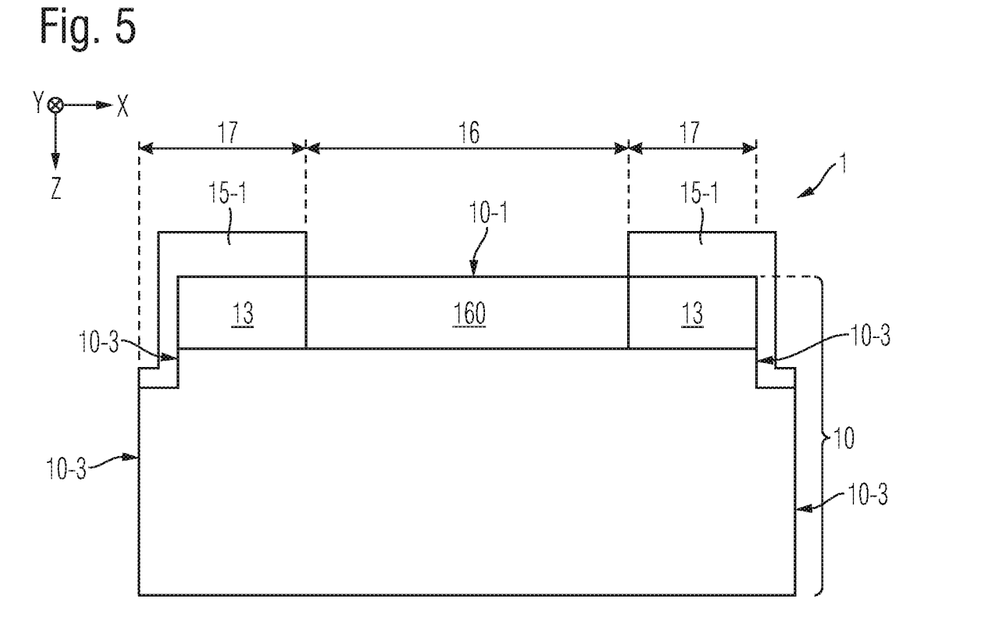
FIG. 5 schematically and exemplarily illustrates a section of a vertical cross-section of a power semiconductor device in accordance with one or more embodiments.

Referring now to FIG. 5, in an embodiment, a portion of the first passivation layer 15-1 may cover at least a portion of a lateral chip edge 10-3 of the semiconductor body 10. For example, a structure like the one that is exemplarily and schematically illustrated in FIG. 5 may have come into being by producing trenches not only in the active area 16 (e.g. gate trenches of an IGBT or a MOSFET), but also in an edge termination region 17 and by performing a chip singulation in such a way that a resulting lateral chip edge 10-9 runs through such a trench. In other words, the trench may be sawn in half upon wafer dicing, resulting in a shape of the lateral chip edge 10-3 as depicted in FIG. 5. Then, the polycrystalline diamond layer 15-1 may be deposited such that the bottom and side wall of said trenches is covered by the first passivation layer 15-1.

Further, in case a second passivation layer 15-2 is arranged in between the front side surface 10-1 and the first passivation layer 15-1, the first passivation layer 15-1 may be arranged such that it encapsulates the second passivation layer 15-2 (i.e., the first passivation layer 15-1 covers the second passivation layer 15-2 from above and from at least one lateral side).

Figure 6:
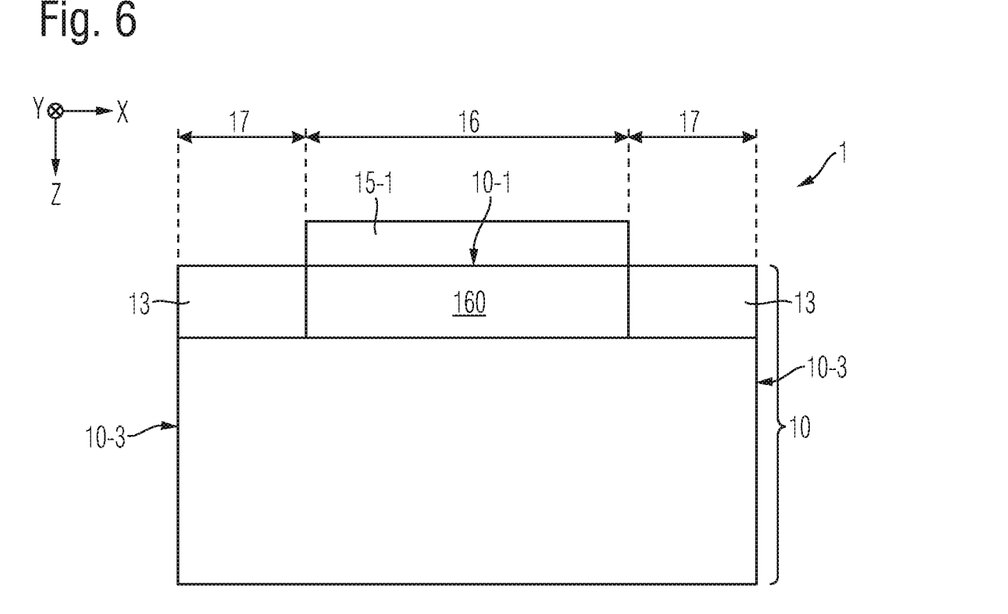
FIG. 6 schematically and exemplarily illustrates a section of a vertical cross-section of a power semiconductor device in accordance with one or more embodiments.

Further, in an embodiment that is schematically and exemplarily illustrated in FIG. 6, it may be provided that the first passivation layer 15-1 extends only inside the active area 16 of the power semiconductor device 1. In other words, in this embodiment, the first passivation layer 15-1 does not extend inside the edge termination region 17. For example, in that case the polycrystalline diamond layer 15-1 may be arranged and configured for the purpose of a flashover protection and a better heat spreading in the active are 16.

According to another aspect, a method of producing a power semiconductor device 1 is presented. The method comprises: providing a semiconductor body 10 having a front side surface 10-1; and forming a first passivation layer 15-1 above the front side surface 10-1, wherein the first passivation layer 15-1 is a polycrystalline diamond layer.

Embodiments of the method correspond to the embodiments of the power semiconductor device 1 described above with respect to the Figures. Hence, what has been stated above may be equally/analogously applied to the power semiconductor device 1 and the method of forming a power semiconductor device 1 for forming further embodiments. Accordingly, the proposed method may further comprise, for example, forming the one or more power cells 160, 161, 162 in the active area 16 and/or the edge termination structures 13, 131, 132, 133 described above in connection with the various exemplary embodiments of the power semiconductor device 1.

In an embodiment of the method of producing a power semiconductor device 1, forming the first passivation layer 15-1 may comprise a deposition of the polycrystalline diamond layer 15-1. For example, the deposition may be carried out at a deposition temperature of at least 350° C., such as at least 400° C., such as for example at about 530° C.

For example, a seeding of a non-diamond substrate may be carried prior to the deposition step. This may involve, e.g., one or more of the following: polishing with diamond powder; ultrasonic treatment with slurry of diamond powder; and coating with a diamond-containing material.

The deposition step may comprise, for example, a chemical vapor deposition (CVD), such as a microwave plasma-enhanced chemical vapor deposition (MPECVD), a hot filament CVD, or a combination of a CVD and a pulsed laser deposition process.

In the above, embodiments pertaining to power semiconductor devices and corresponding processing methods were explained.

For example, these semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising
a semiconductor body having a front side surface;
a first passivation layer arranged above the front side surface;
a second passivation layer arranged between the first passivation layer and the front side surface;
a third passivation layer arranged on the second passivation layer;
wherein the first passivation layer is a polycrystalline diamond layer,
wherein the first passivation layer is arranged at least partially above an active area and an edge termination structure of the power semiconductor device,
wherein the polycrystalline diamond layer comprises crystals having a diameter of at least 10 nm,
wherein the polycrystalline diamond layer has a thermal conductivity of at least 1200 W/(K m),
wherein the second passivation layer comprises at least one of: oxide, amorphous carbon, amorphous silicon, amorphous silicon carbide, and nitride,
wherein the third passivation layer comprises a polyimide layer, an oxide layer and/or a nitride layer.

2. The power semiconductor device of claim 1, wherein a thickness of the first passivation layer is in a range from 30 nm to 2000 nm.

3. The power semiconductor device of claim 1, wherein the polycrystalline diamond layer has a specific heat capacity of at least 400 J/(kg K).

4. The power semiconductor device of claim 1, wherein the polycrystalline diamond layer has an electrical resistivity of at least 1013 Ohm cm.

5. The power semiconductor device of claim 1, wherein the polycrystalline diamond layer has a dielectric strength of at least 1500 kV/mm.

6. The power semiconductor device of claim 1, wherein the edge termination structure comprises a doped crystalline semiconductor region that is in contact with at least a portion of the first passivation layer.

7. The power semiconductor device of claim 6, wherein the doped crystalline semiconductor region comprises at least one of a junction termination extension region and a guard ring.

8. The power semiconductor device of claim 1, wherein the first passivation layer is in contact with a front side metallization of the power semiconductor device.

9. The power semiconductor device of claim 1, wherein a portion of the first passivation layer covers at least a portion of a lateral chip edge of the semiconductor body.

10. The power semiconductor device of claim 1, wherein the power semiconductor device is or comprises at least one of: a diode, an IGBT, a reverse conducting IGBT, a MOSFET, a HEMT, and a thyristor.

11. The power semiconductor device of claim 1, wherein the first passivation layer is a single thickness layer that is arranged partially above the active area.

12. A method of producing a power semiconductor device, the method comprising:
providing a semiconductor body having a front side surface; and
forming a first passivation layer above the front side surface
forming a second passivation layer between the first passivation layer and the front side surface; and
forming a third passivation layer arranged on the second passivation layer,
wherein the first passivation layer is a polycrystalline diamond layer,
wherein the first passivation layer is arranged at least partially above an active area and an edge termination structure of the power semiconductor device,
wherein the polycrystalline diamond layer comprises crystals having a diameter of at least 10 nm,
wherein the polycrystalline diamond layer has a thermal conductivity of at least 1200 W/(K m),
wherein the second passivation layer comprises at least one of: oxide, amorphous carbon, amorphous silicon, amorphous silicon carbide, and nitride,
wherein the third passivation layer comprises a polyimide layer, an oxide layer and/or a nitride layer.

* * * * *